United States Patent [19]

Masson

[11] Patent Number: 4,999,630
[45] Date of Patent: Mar. 12, 1991

[54] FAST ANALOG-DIGITAL CONVERTER WITH PARALLEL STRUCTURE

[75] Inventor: Thierry Masson, St Egreve, France

[73] Assignee: Thomson Composants Militaires et Spatiaux, Paris, France

[21] Appl. No.: 273,013

[22] Filed: Nov. 18, 1988

[30] Foreign Application Priority Data

Nov. 20, 1987 [FR] France .................. 87 16073

[51] Int. Cl.$^5$ .................. H03M 1/10; H03M 1/36
[52] U.S. Cl. .................. 341/120; 341/159
[58] Field of Search .............. 341/159, 155, 118, 161, 341/120; 307/585, 451, 304

[56] References Cited

U.S. PATENT DOCUMENTS

| | | | |
|---|---|---|---|
| 3,611,350 | 10/1971 | Leibowitz et al. | 341/159 |
| 4,547,763 | 10/1985 | Flamm | 341/159 X |
| 4,596,978 | 6/1986 | Fujita | 341/159 |
| 4,649,371 | 3/1987 | Kolluri | 341/159 |
| 4,794,374 | 12/1988 | Koike | 341/155 X |

FOREIGN PATENT DOCUMENTS

| | | |
|---|---|---|
| 0101571 | 2/1984 | European Pat. Off. . |
| 2536923 | 6/1984 | France . |

OTHER PUBLICATIONS

IEEE International Solid-State Circuits Conference, vol. 28, conference 32, Feb. 1985, pp. 34–35, 298–299, IEEE, Coral Gables, Fl., U.S., T. Tsukada, et al.

Primary Examiner—William M. Shoop, Jr.
Assistant Examiner—Sharon D. Logan
Attorney, Agent, or Firm—Oblon, Spivak, McClelland, Maier & Neustadt

[57] ABSTRACT

Disclosed is an analog/digital converter designed to convert an analog voltage into a digital voltage with n bits. The converter comprises:

$p = 2^n$ comparators capable of comparing the analog voltage with a reference analog voltage obtained by a voltage generator, each comparator comprising an inverter amplifier, a capacitor having a first terminal connected to the input of the amplifier and wherein, before the application of the analog voltage, each amplifier is connected in short-circuit feedback loop while the reference voltage is applied to the other terminal of the capacitor, this operation being performed no longer in parallel for all the amplifiers but successively, one after another in order to reduce the consumption of current during this operation.

8 Claims, 5 Drawing Sheets

FAST ANALOG-DIGITAL CONVERTER WITH PARALLEL STRUCTURE

BACKGROUND OF THE INVENTION

1. Field of the Invention

The invention concerns a fast analog/digital converter with a parallel structure.

2. Description of the Prior Art

The term "analog/digital converter with parallel structure" refers to a converter such as the one shown in FIG. 1.

To obtain fast conversion, the converter has $2^n$ comparators identical to the comparator 10, working in parallel, n being the number of converter output bits. Each comparator receives, firstly, the analog voltage Vin to be converted into a binary digital value of n bits and, secondly, a respective reference voltage which is a fraction, expressed in multiples of $1/2^n$, of a general reference voltage Vref. Thus, for example, for an eight-bit converter ($2^8 = 256$), the first converter receives Vref/256 as the reference voltage, the second comparator receives 2Vref/256, the third comparator receives 3Vref/256, etc. up to the last comparator which receives Vref.

Each of the comparators gives a binary output logic level indicating whether the voltage Vin is greater or smaller than its respective reference voltage.

The outputs of all the comparators are applied to a logic decoding circuit 20. This decoding logic circuit 20 thus receives $2^n$ logic signals which, if examined successively, are in the form of a series of logic signals with a first level (for all those comparators for which the reference voltage is smaller than the voltage to be converted), followed by a series of logic signals with a second level (for all the other comparators). The decoding circuit determines the position of the change in logic level in this dual series and gives an n-bit word representing this position or, as the case may be, an indication that the capacity of the converter has been exceeded.

The reference voltages are set up by means of a high-precision resistive divider bridge, formed by $2^n$ series-mounted resistors with a common value R and powered by the overall reference voltage Vref. An intermediate connector is provided at each junction point of two resistors R, and this connector is connected to an input of a respective comparator to bring it a corresponding reference voltage which is a fraction that is a multiple of $1/2^n$ of Vref.

FIG. 1 gives a schematic view of an eight-bit converter. The reference voltages are designated by V1, V2 ... Vr, ... V255, Vref. A single comparator 10 has been shown, receiving a reference voltage Vr.

In integrated circuit technology, low voltages are used and the reference voltage Vref may not exceed two volts. Consequently, the elementary pitch between two consecutive reference voltages is 2/256 volts, giving about eight millivolts. It is therefore imperative to use, as comparators, differential amplifiers with very low offset voltage at the input, failing which the comparison would make no sense.

This is why use is made of comparators associated with a capacitor which memorizes the offset voltage and restores it by adding it to the difference between the voltages to be compared, in such a way that the flip-over of the comparator results only from the sign of this difference, irrespectively of the value of the offset voltage.

The single comparator 10, shown in FIG. 1, is a comparator of this type, with elimination of offset voltage. It has an amplifier-inverter 12, an input capacitor C of which one terminal is connected to the input of the amplifier and of the change-over switching means (switches IE, IE', IC which may be insulated-gate field-effect transistors) controlled by a control logic circuit (not shown).

The switch IE can be used to connect the reference voltage Vr, corresponding to this comparator, to the other terminal of the capacitor C;

The switch IE' can be used to connect the analog voltage Vin to be converted to the other terminal of the capacitor C;

The switch IC can be used to set up a short-circuit feedback loop of the amplifier 12 with its input.

The change-over control logic circuit works cyclically in essentially two stages.

In a first stage a, the switch IE is shut; outside this stage it stays open.

In a second stage c, the switch IE' is shut; outside this stage, it stays open. In practice, the stages a and c are complementary.

Within one of these stages, in practice during a stage b which essentially coincides with the first stage a but which must imperatively end slightly before it, the switch IC is shut. If need be, the stage b could coincide with the stage c and not the stage a.

In practice, the stage b coincides with the stage a. The stage a is applied to all the comparators at the same time so that the capacitor C of each comparator takes a load C (Vr−Vs), Vs being the offset voltage of the inverter 12. This stage therefore makes it possible to take each inverter 12 into account. This stage is conventionally called an auto zero stage.

Quite clearly, this stage must be applied to all the comparators before the voltage Vin to be converted is applied, said voltage being applied during the stage c. Thus, each comparator is ready to receive the voltage Vin and flips over or does not flip over, without any deterioration due to the initial conditions in which it is placed when this voltage Vin is applied.

Fresh problems now face the specialist who is seeking to make fast converters with higher resolution than that obtained by existing converters. For, the specialist encounters difficulties in making the device as soon as he seeks to obtain converters with more than 8 bits, particularly in MOS technology.

The usual approach is, firstly, to increase the speed of the converters, to increase the size of the transistors which fulfill the inverter function. Now, this increase in size causes an increase in current consumption which is not bothersome in itself but becomes bothersome when, in addition to this, there is an increase in consumption due to an increase in the number of comparators. For, during the stage b (which, in practice, corresponds to the stage a), the switch C is closed for all the comparators. These comparators are thus connected in feedback loops with unitary gain. This corresponds to their maximum consumption point, and this consumption is all the higher as the bits, comprising:

a reference voltage generator;

$2^n$ comparators capable of comparing the analog voltage with a reference voltage, each comparator comprising an inverter amplifier, a capacitor having a first terminal connected to the input of the amplifier;

change-over switching means and a control logic circuit for these means working cyclically according to the following cycle:

during a first stage (a) of each cycle, the amplifier is in short-circuit feedback loop, while the reference voltage is applied to the other terminal of the capacitor;

during a second stage (c), the amplifier is no longer connected in short-circuit feedback loop, and the analog voltage is applied to the other terminal of the capacitor;

wherein at a given instant, one or more comparators are in the first stage (a) while all the other converters are in the second stage (c); so that, successively, each comparator goes through this first stage while the other comparators are in the second stage (c);

and the control logic circuit has means to generate clock signals to sequence the passage of each comparator in the first stage (a) and then in the second stage (c) by the activation of change-over switching means, said converter comprising means to decode the signals given by the comparators.

Another object of the invention is the making of an analog/digital converter wherein the reference voltage generator is made by means of a precision resistors bridge.

Another object of the invention is the making of an analog/digital converter wherein the voltage generator is formed by a digital/analog converter with m bits, m being greater than n, said converter being driven by a digital counter driven by the clock signal generating means. Another object of the invention consists in the making of an analog/digital converter in which the clock signal generating means are formed by a shift register, the output of which drives the input and which is controlled by an external clock.

Another object of the invention is an analog/digital converter wherein the decoding means have $2^n$ flip flops, each receiving the output signal of a comparator and delivering this signal at the rate of an external clock, the output result of each flip flop being forced into a given state when this flip flop is connected to a comparator which is in the stage a of operation (auto zero) while all the others are in the stage c. comparators are faster and more sensitive. Furthermore, during the stage b, the $2^n$ comparators and $2^n$ capacitors are connected to the bridge of resistors. Firstly, this introduces dynamic disturbances on the bridge, and the bridge cannot recover its initial state until a relatively long period has elapsed. This period is all the longer as the number of comparators is great. Consequently, in practice, the specialist cannot make parallel, fast analog/digital converters with more than 8 bits in MOS technology.

The invention makes it possible to overcome these problems unexpectedly through an operation which is no longer done in the usual way with in a single stage a, synchronous for all the comparators, but in stages $a_1, a_2 \ldots a_p (p=2^n)$ applied sequentially to one or more comparators at a time, without thereby causing any deterioration in the result of the conversion. Thus, the comparators continually give the position of the input signal Vin and logic data are taken at the rate of a clock which is independent of the stages $a_1, a_2 \ldots a_p$, each comparator having an auto zero stage proper to itself.

SUMMARY OF THE INVENTION

An object of the present invention therefore comprises the making of an analog/digital converter designed to convert an analog voltage into a digital voltage of n bits Another object of the invention is an analog/digital converter wherein the decoding means further have logic gates connecting the outputs of the flip flops in sets of three to enable the detection of a transition in state in order to ascertain the binary encoding of the input voltage Vin.

BRIEF DESCRIPTION OF THE DRAWINGS

Other features and advantages of the invention will emerge more clearly from the following detailed description, made with reference to the appended figures, of which.

DESCRIPTION OF PREFERRED EMBODIMENTS

Figure 2:
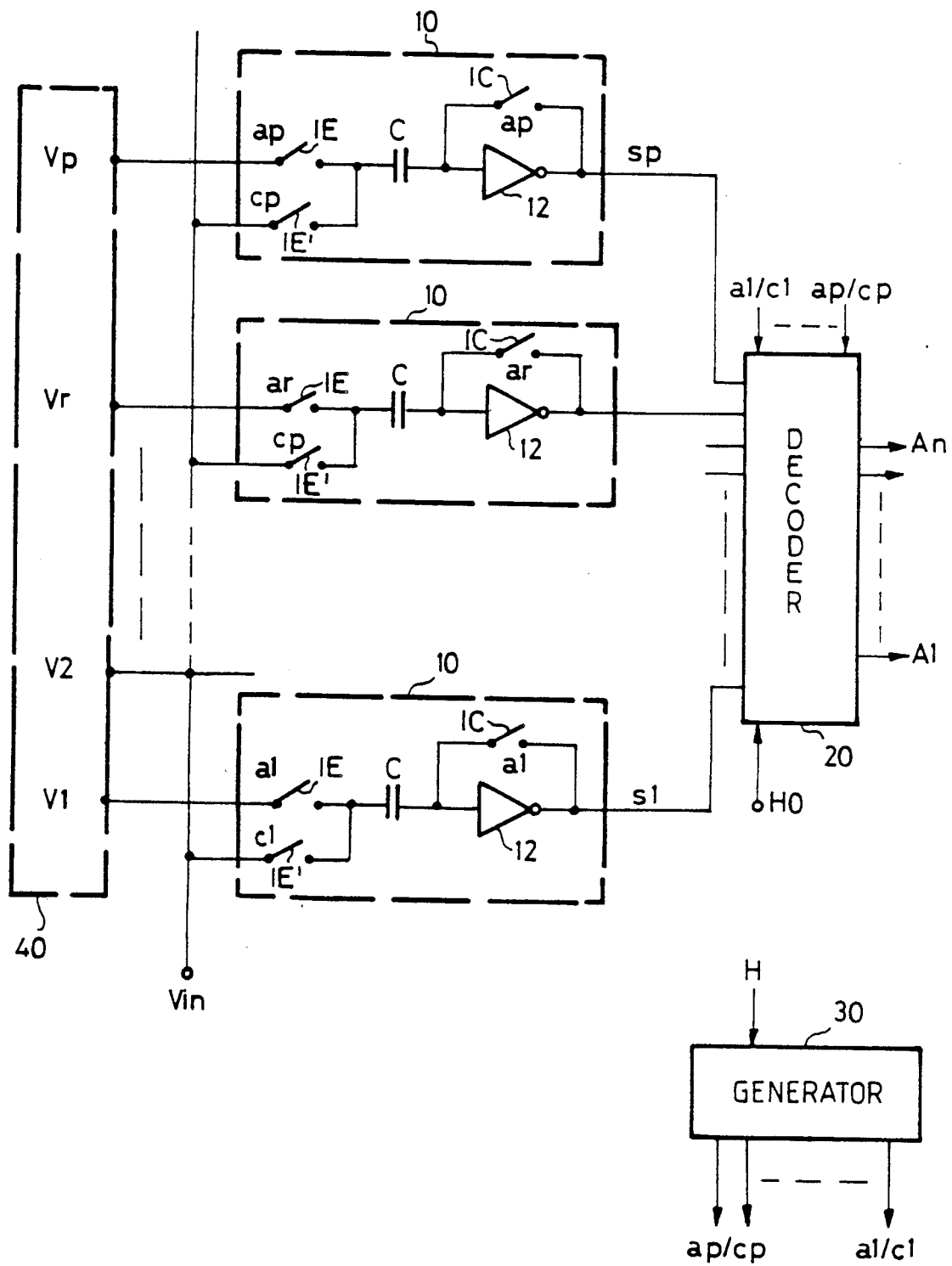
FIG. 2 shows an analog/digital converter according to the invention.

FIG. 2 shows an analog/digital converter which again shows comparators 10 comprising a capacitor C which can be connected by a first terminal to a reference voltage Vr, by means of a first change-over switch IE, or to the analog voltage Vin by means of a second change-over switch IE'. The second terminal of the capacitor C is connected to the input of an inverter gate 12. The output of the gate is connected in feedback loop to the input by means of a change-over switch IC. The output of each gate 12 is connected to an input of a decoder 20 which delivers, at its output, at the rate of an external clock HO, the digitalized voltage corresponding to the analog voltage Vin.

This figure shows, as an example, p reference levels from V1 to Vp, Vref being the overall total reference, p being equal to 1024. This corresponds to 1024 levels, thus enabling the conversion on 10 bits ($2^{10}=1024$). Each level is a reference level with which the analog voltage Vin is compared. The first comparator 10 will therefore compare the voltage Vin with the reference voltage V1 which is equal to Vref/1024; the voltage V2=2Vref/1024. These reference levels are got by a voltage generator 40, using the general reference Vref.

Figure 3:
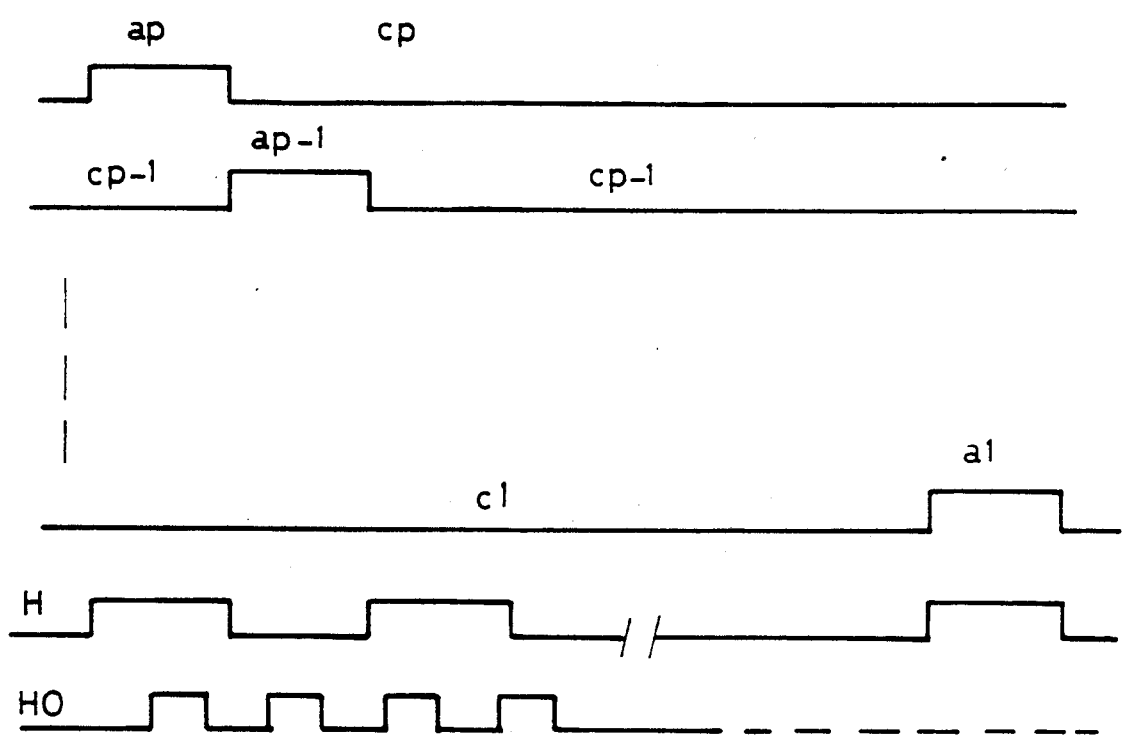
FIG. 3 shows the various clock signals and, especially, the change-over stages of the change-over switches.

The conversions are done at the rate of the clock HO which is an external clock given by the user. Another clock H enables a generator 30 to give clock signals, shown in FIG. 3, corresponding to the operational stages, a1/c1, a2/c2 ... ap/cp respectively, resulting in the periodic storage of the offset voltage of each comparator. Each comparator works periodically according to the following cycle:

during a first stage a (i.e. a1 for he first comparator 10, $a_p$ for the $p^{th}$ comparator, of each cycle, the amplifier is connected in a short-circuit feedback loop while the reference voltage is applied to the other terminal of the capacitor;

during a second stage c, the amplifier is no longer connected in a short-circuit feedback loop and the analog voltage Vin is applied to the other terminal of the capacitor. This amplifier continually follows the development of the analog voltage Vin.

While the first comparator is in the stage a1, the other comparators are in the stage c so much so that, during the stage a1, the amplifier looped on itself has, at its input, a voltage which is equal to its threshold voltage (also called the offset voltage) Vs.

With the switch IE shut and the switch IE' open, the capacitor C takes a charge C (Vs-V1) whereas, in the meantime, all the capacitors of the other comparators stage a. When the counter has reached $2^n$ (1024), all the reference levels have been delivered. The reference levels generation cycle starts again.

Figure 6A:
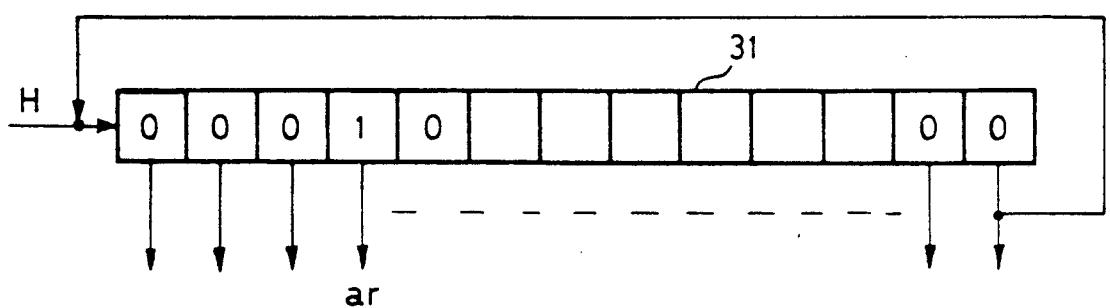
FIGS. 6a and 6b show an embodiment of the clock generator according to the invention according to two possible configurations.

FIG. 6a shows a first embodiment of the clock generator according to the invention.

The generator 30 is formed by a shift register 31 in which a logic state, for example "1", circulates, all the other states being zeros. The register 31 is driven by the clock H. Each output stage of the register corresponds to a signal for the activation of the switches IE and IC of a given comparator. The output of the last stage of the register is looped to the input. It is also possible to use a divider by $2^n$ at the input of the register 31 instead of connecting the output of the register to its input. At each passage of the logic "1" state in a stage, the stage containing this state delivers a signal corresponding to the first stage $a_r$ of operation of each comparator. Thus, at the output of the first stage, there is obtained, for example, the stage a1 and then, successively, at the output of the last stage, the stage $a_p$.

Should several comparators be in the first operating stage, the generator must generate several synchronous signals (the same number as the number of comparators in the first stage) corresponding to a first stage of operation $a_r$ $a_i$ $a_j$ for these comparators. For receive the voltage Vin at one terminal and the voltage applied to the amplification input at the other terminal, this voltage being no longer the voltage Vs but a voltage Ve. During this stage, the change-over switch is shut.

At the end of this stage a1, the stored charge remains stored at the terminal of the capacitor which is connected to the input of the amplifier. For, since the input impedance of the amplifier is high, no flow can take place.

The stage c1 is then applied to this first amplifier, while the stage a2 is applied to the second amplifier. The switch IE being shut and the switch IE' being open, the capacitor C of this second comparator takes a charge C (Vs−V2) whereas, in the meantime, all the switches IE of the other comparators are open and the switches IE' are shut.

Successively, the voltage applied to a terminal of the capacitor of each comparator goes from a reference voltage (V1 for the first comparator . . . , V1024 for the last comparator) to the voltage Vin. According to the distribution of charges which takes place when going from a stage a to a stage c, the sum of the charges stored remains constant and the flip-over direction of the comparator depends only on the sign of the difference Vin-V1, Vin-V2 etc., the threshold voltage having no influence according to this known configuration of each comparator.

The decoder 20 delivers the decoded voltage at the clock rate HO which is independent of the different stages.

Thus, a single comparator is at the maximum consumption point, this comparator being the one in the stage a. The other comparators consume power only if the analog voltage Vin is close to the associated reference voltage. The total consumption is greatly reduced as compared with the prior art. This makes it possible, in particular, to increase the current to improve the speed of the converter.

The decoder 20 is also activated by the phase signals a1, a2 . . . ap. When a comparator r is in the phase $a_r$, the state of the output of the decoder corresponding to the $r^{th}$ comparator is enforced by this stage $a_r$. The output state of the comparator, which is in the stage a (a1, a2, . . . ap), is forced to a predefined state which is always a "1" (or always a "0") to detect the position at which the transition occurs, namely the passage from a series of identical logic states to another series of states which are identical but complementary and to ascertain the n encoding bits of the analog voltage.

The forcing of the state of the output of the comparator, which is then at the stage a while there is a conversion, and the associating of three-input AND logic gates with the output of the flip flops which freeze the output stage of the comparators minimizes the encoding errors which might be caused by the successive application of a stage a to each comparator while a conversion stage takes place for the other comparators. The AND logic gates are made by means of a three-input NAND gate 22 followed by an inverter gate 23. For example, the flip flop associated with the $n^{th}$ comparator delivers the signal Bn applied to an input of the associated gate 22, which receives the signal Bn−1 at another input and the signal Bn+1 (obtained by the gate 24) at another input A demultiplexer 25 with $2^n$ inputs and n outputs gives the signals A1-An corresponding to the n encoding bits of the voltage Vin.

Figure 4:
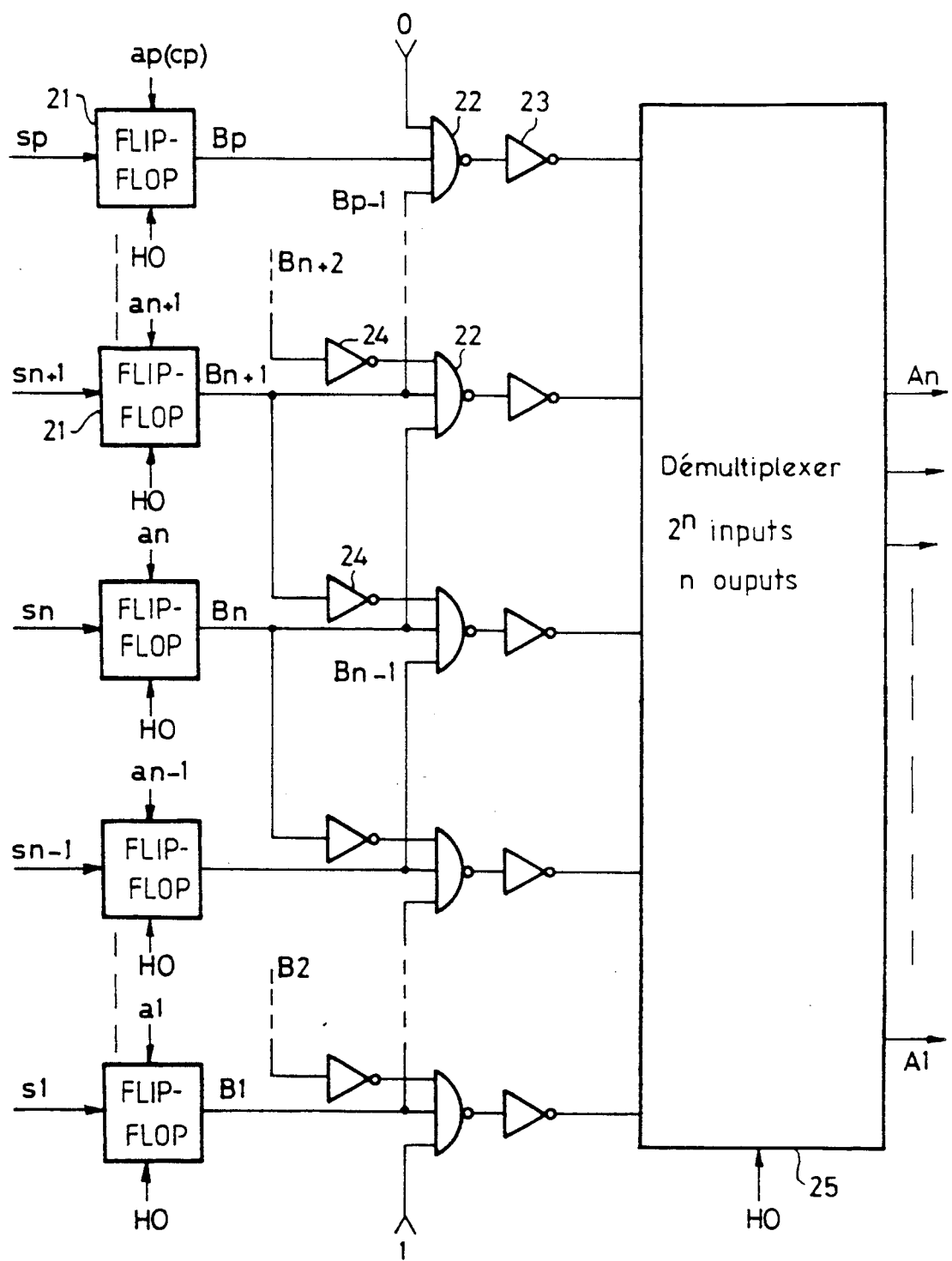
FIG. 4 shows an embodiment of a decoder 20 according to the invention.

The embodiment of a decoder of this type is given in FIG. 4.

When the enforced state is a logic "1" state, the decoder must detect a transition when the states 011 appear in this order. When the state enforced is a logic "0", the decoder must detect a transition where the states 001 appear in this order.

When the state of a comparator for which the reference voltage is different from the analog voltage Vin is enforced to "1", the output of the flip flop connected to this comparator gives a "1" while the flip flops connected to the other comparators, which also have a different reference voltage from the analog voltage Vin all give a ."0" (or all give a "1"): the decoder does not generate any false code for it is not possible to have the transition 011 at the level of this comparator. The enforcing of the flip flop to "1" by means of the AND gates with at least three inputs prevents the introduction of an encoding error. Of course, if the state imposed on a flip flop is "0" the transition detected is then the succession of states 001, and the enforcing to "0" prevents the introduction of an encoding error for the same reasons.

Should the state of a comparator, for which the reference voltage is close to the analog voltage Vin, be forced to "1" the output of the flip flop connected to this comparator gives a "1" while the flip flop of the comparator which has a reference voltage equal to the analog voltage Vin also gives a "1", and while the comparators, which have a reference voltage greater than this analog voltage Vin, deliver a "0" (or a "1") and while all the comparators which have a reference voltage below this voltage Vin give a "1" (or a "0"). The decoder detects a transition through the presence of the successive states 011 while the first state "1" encountered does not obligatorily correspond to a "1", this state having been enforced. It may be, therefore, that solely in this case (which occurs when the comparator, which is in the stage a, is at a reference voltage close to the analog voltage Vin), there is an encoding error. If this error occurs, it concerns only the less significant bit $Vref/2^n$, and this is so only when the signal is at the level of the reference voltage of the comparator in the stage a. This error becomes negligible once the resolution is high, for example when n is greater than or equal to 6 as is the case with the converter.

Figure 1:
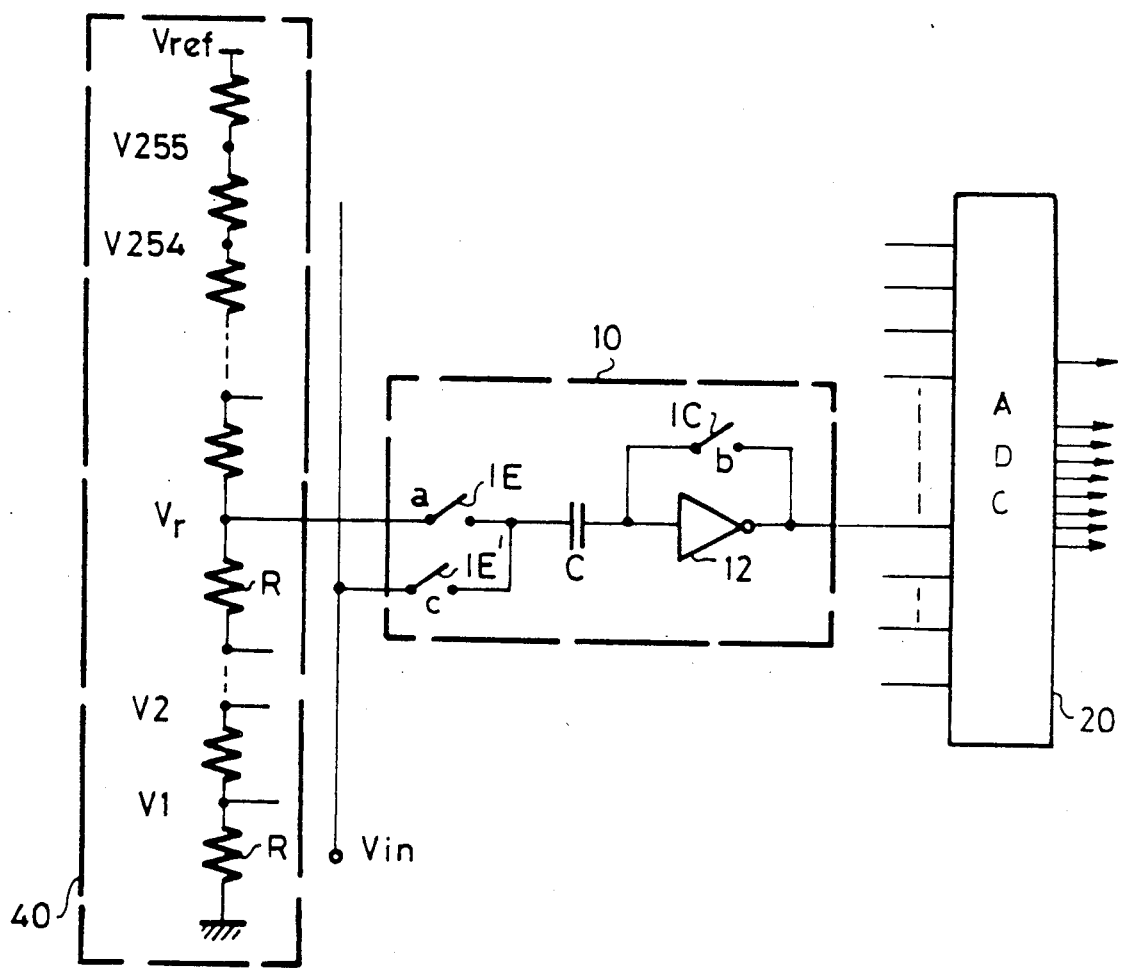
FIG. 1, already described, shows a prior art analog/digital converter.

As shown in FIG. 1, the reference voltages can be obtained by means of a precision resistors bridge: since only one comparator at a time is connected to the bridge, the problems of dynamic disturbance are removed.

Figure 5:
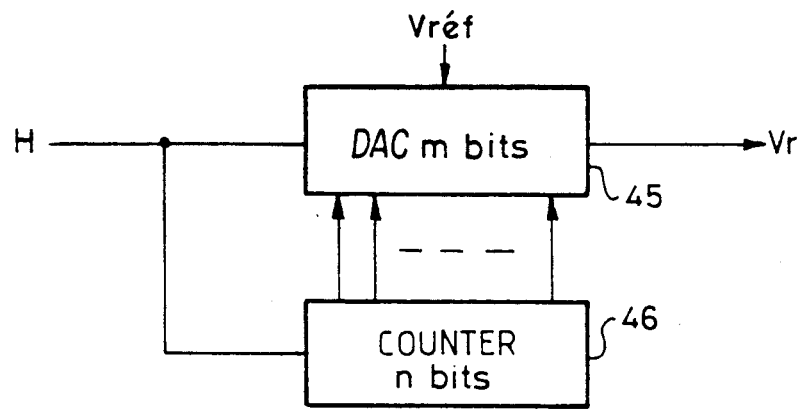
FIG. 5 shows a second embodiment of the reference voltage generator.
Figure 6B:
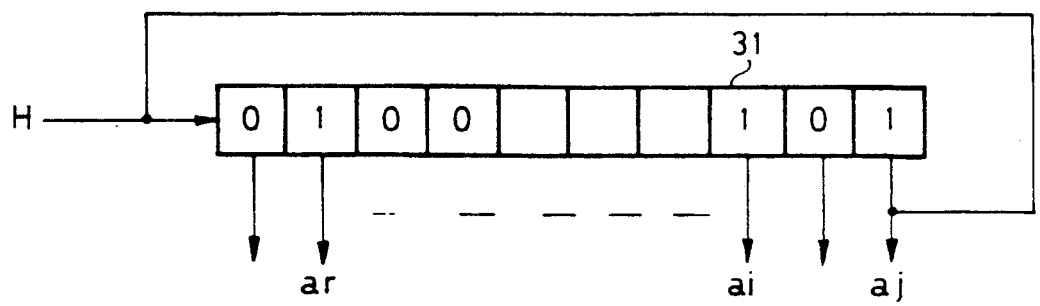

It is also possible to obtain very high precision reference voltage levels by means of a circuit having a digital/analog converter as shown in FIG. 5. The converter used preferably has higher resolution than that of the analog/digital converter made, that is n bits (m>n, m=12 bits for example). The converter is driven by the n-bit digital counter. The (m−n) less significant bits of the digital/analog converter are unused and are, for this purpose, zero-set for example. The converter and the counter are driven by the clock H. The counter is triggered by the clock H. Each incrementation of the counter corresponds, at the output of the digital/analog converter, to a reference voltage level for the comparator in the this, as shown in FIG. 6b, the register 31 has several logic "1" states which circulate. Each output stage of the register also corresponds to a signal for the activation of the change-over switches. At each passage of a logic "1" state, the output signal corresponds to an operating phase a for the comparators.

The invention therefore enables a reduction in consumption since only one or only a few amplifiers of the converter are connected in feedback loop with unitary gain. It also makes it possible, when the generator of reference voltages is made by means of a resistor bridge, to eliminate practically all the disturbances on the bridge. Consequently, it enables the making of converters with resolution values of greater than 8 bits: this was not possible with the prior art. It also enables the use of a digital/analog converter instead of a bridge of resistors, to have greater precision in the reference voltages.

Furthermore, instead of having only one comparator at a time in the stage a, it is possible to put upto about 10 comparators in a state of operation corresponding to the stage a while remaining, at the same time, within the spirit of the invention. Of course, this number should be smaller than 1024 if the converter has 1024 comparators.

The invention can be applied, notably, to circuits using insulated-gate, field-effect transistors (MOS, MESFET) transistors.

What is claimed is:

1. An analog/digital converter designed to convert an analog voltage into a digital voltage with n bits, comprising:
   a plurality of comparators capable of comparing the analog voltage with a reference voltage obtained by a voltage generator, each comparator comprising an inverter amplifier, a capacitor having a first terminal connected to the input of the amplifier;
   change-over switching means and a control logic circuit for these means working cyclically according to the following cycle:
      during a first stage of each cycle, the amplifier is in a short-circuit feedback loop, while the reference voltage is applied to a second terminal of the capacitor;
      during a second stage, the amplifier is no longer connected in the short-circuit feedback loop, and the analog voltage is applied to said second terminal of the capacitor;
   wherein at a given instant, one or more but less than all the comparators are in the first stage so that, successively, each comparator goes through this first stage while the other comparators are in the second stage; and
   the control logic circuit has means to generate clock signals to sequence the passage of each comparator in the first stage and then in the second stage by activation of the change over means;
   said converter comprising means to decode the signals given by the comparators.

2. An analog/digital converter according to claim 1, wherein the voltage generator is made by means of a precision resistors bridge.

3. An analog/digital converter according to claim 1, wherein the voltage generator is formed by a digital-/analog converter with m bits, m being greater than n, said converter being driven by an n-bit digital counter.

4. An analog/digital converter according to any of the claims 1 to 3, wherein the clock signals generating means are formed by a shift register, within which there circulates a logic state corresponding to a first stage of operation for the comparator connected to the output of the stage containing this state, each output of the register being connected to a comparator, the output of the last stage of this register being looped to the input of the register.

5. An analog digital converter according to any of the claims 1 to 3, wherein the clock signals generating means are formed by a shift register inside which there circulate several logic states corresponding to a first stage of operation for the comparators connected to the outputs of the stages containing these states, each output of the register being connected to a comparator, the output of the last stage of this register being looped to the input of the register.

6. An analog/digital converter according to claim 1, wherein the means to decode has $2^n$ flip flops, each flip flop receiving the output signal from a comparator and a clock signal corresponding to a first stage or to a second stage of operation of the comparator; the output of each flip flop being connected to at least one input of a three-input logic gate; and wherein the passage of the clock signal to a first stage forces the output signal of the flip flop which receives this clock signal to a predetermined logic state.

7. An analog/digital converter comprising a plurality of comparators for comparing an analog voltage to be converted and a plurality of respective reference voltages, each comparator comprising calibrating means, said converter further comprising control means for controlling operation of said comparators, said control means periodically activating the calibrating means of each comparator to effect a calibration stage and there-after activating the comparator for a comparison stage, wherein said control means activates the calibrating means of any given comparator for effecting a calibration stage and simultaneously activates remaining comparators other than said given comparator for effecting a comparison stage, and wherein said control means further successively activates the calibrating means of all comparators.

8. An analog/digital converter according to claim 7, wherein said control means activates the calibrating means of a given comparator for effecting a calibrating stage and simultaneously activates all comparators other than said given comparator for effecting a comparison stage.

* * * * *